United States Patent [19]

Brown et al.

[11] 4,288,282

[45] Sep. 8, 1981

[54] METHOD FOR PRODUCING A METALLIC PATTERN UPON A SUBSTRATE

[75] Inventors: Lawrence E. Brown; James L. Bauer; Gerald W. Scheck, all of Loveland, Colo.

[73] Assignee: Hewlett-Packard Company, Palo Alto, Calif.

[21] Appl. No.: 79,865

[22] Filed: Sep. 28, 1979

[51] Int. Cl.³ .................... B44C 1/22; C23F 1/02; H01L 21/312
[52] U.S. Cl. .................... 156/630; 156/633; 156/634; 156/656; 156/659.1; 156/668; 156/661.1; 428/199; 428/203; 428/209; 430/275; 430/323; 430/328; 430/394
[58] Field of Search ............... 156/629, 656, 668, 630, 156/632, 633, 634, 659.1, 661, 666, 904; 430/323, 328, 273, 275, 394; 428/199, 201, 203, 209, 210, 256

[56] References Cited

U.S. PATENT DOCUMENTS 3,761,264  9/1973  Sterzer .................... 430/323
4,171,240 10/1979  Wong ...................... 156/688
4,175,963 11/1979  Crivello ................... 430/328

Primary Examiner—Bruce H. Hess
Attorney, Agent, or Firm—Edward L. Miller

[57] ABSTRACT

A metallic foil is laminated to a transparent substrate with a photopolymerizable adhesive. An outer layer of photoresist is used in etching a pattern in the foil. The etched foil itself is then used as a resist in the complete removal of the uncovered portions of the adhesive, leaving the transparency of the revealed substrate material totally unimpaired. Finally, the remaining adhesive is hardened by polymerization resulting from exposure to ultraviolet light passed through the substrate from the unlaminated side.

2 Claims, 3 Drawing Figures

A DIGITIZING PLATEN CONSTRUCTED ACCORDING TO THE PRINCIPALS OF FIG 1

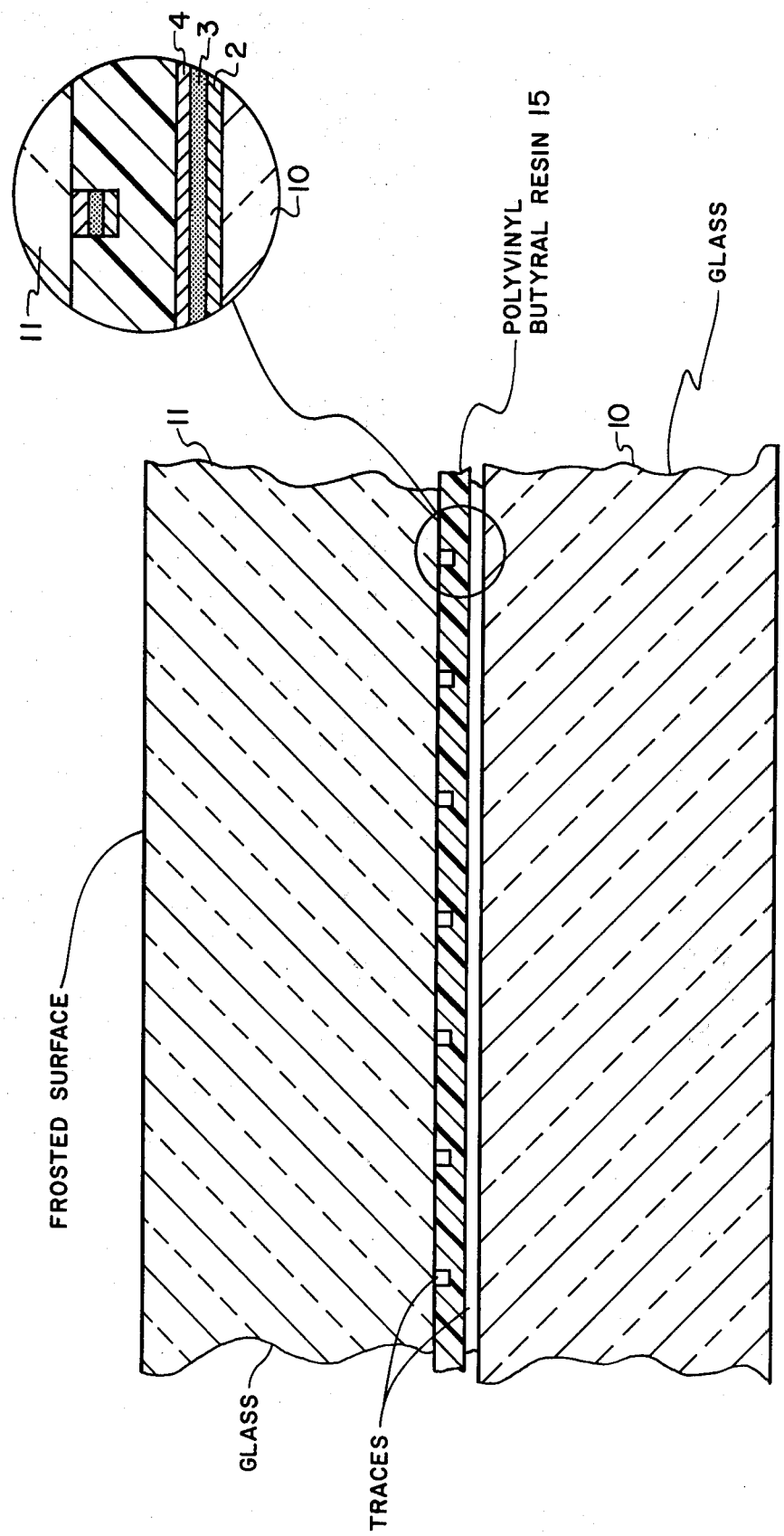

METHOD FOR PRODUCING A METALLIC PATTERN UPON A SUBSTRATE

BACKGROUND AND SUMMARY OF THE INVENTION

This invention relates to methods for producing metallic patterns upon substrates. The invention is especially advantageous in applications requiring dimensional control and positional stability of a conductive metallic pattern upon a transparent substrate. The pattern so produced might simply remain on one side of a transparent substrate, as in some electric defrosters for automotive windows. Alternatively, it might be sandwiched between two substrates subsequently laminated together, as in some radio antennae imbedded within automotive windshields. A further example is a digitizer platen suitable for rear projection of images to be digitized. The dimensional accuracy and relative position of the conductive grids within such a digitizer platen must be carefully controlled if the digitizer is to be accurate. Furthermore, the method of producing the grids must not interfere with the transparency of the platen.

There exist techniques for vapor deposition of a metallic film upon a substrate. These techniques suffer from a number of disadvantages: high cost; low yield; poor adhesion of the metal to certain substrates, such as glass; lack of uniform thickness of the deposited metal; and, lack of solderability to the resulting pattern. Sputtering techniques suffer similar disadvantages. In addition, both these techniques suffer from the additional disadvantage that only relatively thin conductors can be reliably produced, rendering the conductors unsuitable for use in high current applications.

There are techniques for attaching a metal foil to a substrate with a resin. However, after the foil is etched to produce the desired pattern the resin itself remains. The resin interferes substantially with the transparency of transparent substrates, and its continued presence may be unwanted even with nontransparent substrates. The resin is extremely difficult to remove since solvents that remove the resin also loosen the foil.

There are also techniques for simply placing a preformed metallic foil, or a pattern wound from wire, between two transparent substrates before they are laminated together with a transparent adhesive. The main disadvantage with this technique is that the adhesive material used to laminate the substrates may flow substantially during the lamination process, and may carry the pattern with it and prevent the pattern from having precise dimensional and positional characteristics.

Because of these difficulties, transparent digitizer platens have heretofore either been difficult to produce or of less than optimum transparency.

Accordingly, a primary object of the invention is to provide a method for accurately producing a metallic pattern of good dimensional stability upon a transparent substrate without interfering with the transparency of the substrate in those regions where the metallic pattern is absent.

A further object of the invention is to provide a method for producing upon a transparent substrate a solderable metallic pattern having good adhesion to the substrate, without interfering with the transparency of the substrate in those regions where the metallic pattern is absent.

Another object of the invention is to provide a method for producing upon a transparent substrate a metallic pattern having electrical properties that are uniformly controllable without interfering with the transparency of the substrate in those regions where the metallic pattern is absent.

A further object of the invention is to provide a method for producing highly accurate metallic grids sandwiched between plates of transparent material, for use as a platen in a digitizer.

A still further object of the invention is to provide a method for attaching a metal foil to a substrate such that no undesirable residue remains after portions of the foil are etched away.

These and other objects of the invention will become apparent to those skilled in the art as the summary and detailed description of the invention proceed.

A summary of a preferred method of practicing the invention is as follows. First, a transparent substrate upon which a metallic pattern is to be produced is thoroughly cleaned. The substrate then has laminated to it a layer of photopolymerizable adhesive. Next, a layer of metal foil is laminated to the layer of photopolymerizable adhesive. A layer of photosensitive resist is then applied to the exterior side of the metal foil. The layer of photosensitive resist is exposed according to the desired pattern and the unwanted metal in the foil is uncovered by removal of the corresponding portions of the photosensitive resist. This is done without exposing the layer of photopolymerizable adhesive. Next, the unwanted metal is etched away, uncovering portions of the layer of unexposed photopolymerizable adhesive.

Finally, the method includes removal of the uncovered portions of the photopolymerizable adhesive. Since the adhesive layer is still unexposed it is still removable by etching in a suitable solution. The metallic pattern itself serves as a resist in the removal of the uncovered portions of the adhesive layer. The unremoved adhesive is hardened by at last exposing the remaining portions of the adhesive layer. This is easily done by using the transparency of the substrate to illuminate the adhesive with actinic radiation from the unlaminated side of the substrate. This polymerizes the adhesive and renders it hard.

In the case where a digitizer platen is being constructed, two such metallic patterns, each in the form of a grid, are produced. One is produced upon the underside of an upper piece of glass, and the other is produced on the upper side of a lower piece of glass. Ribbon conductors are soldered to the grids for connecting them to the circuitry of the digitizer. Finally, the two pieces of glass are registered and laminated together with an intermediate layer of polyvinyl butyral resin to form a single piece of safety glass. The resin not only causes adhesion between the two pieces of glass, but also insulates the upper and lower metallic grids from each other.

BRIEF DESCRIPTION OF THE DRAWINGS

FIG. 3 is an enlarged cross sectional view (not to scale) of the digitizer platen of FIG. 2.

DESCRIPTION OF THE PREFERRED PROCEDURE

Figure 1:
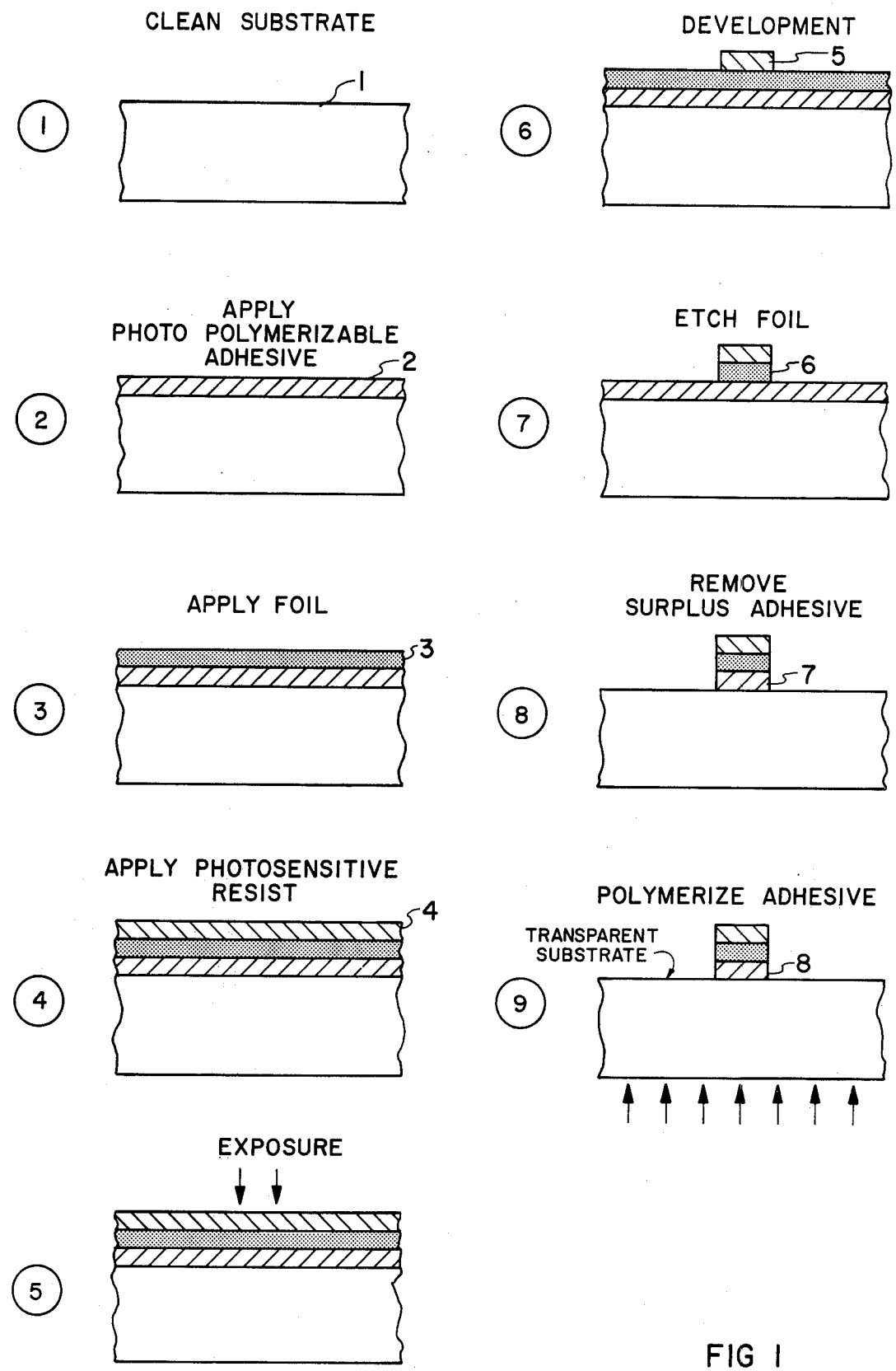
FIG. 1 illustrates a preferred sequence of steps for producing a metallic pattern upon a transparent substrate using photoetching methods and an etchable photopolymerizable adhesive for attaching a metallic foil to the substrate.

Depicted in FIG. 1 are a series of nine steps in a preferred procedure for producing a metallic pattern upon a substrate. Steps one through three involve attaching a metallic foil to a substrate with a photopolymerizable adhesive. Steps four through seven involve etching a pattern in the metallic foil. Steps eight and nine involve the removal of the excess adhesive and the polymerization of the remaining adhesive.

Step one in FIG. 1 is the cleaning of a possibly transparent substrate 1 to remove any oil films, or other contaminants. In the case of the digitizer platen of FIG. 2 the substrate is transparent and comprises a piece of glass. The glass is cleaned by first spraying it with an alkaline detergent solution in a mechanical washer, rinsing it with hot water for five minutes, and then dipping it from two to twenty minutes in a 5%–50% solution of ammonium bifluoride at a temperature of 40°–70° C. This is followed by another hot water rinse for five minutes. Water must then flow in an unbroken sheet across the glass, or the cleaning process is repeated.

Step two in FIG. 1 is the application of a layer 2 of photopolymerizable adhesive to the surface of the substrate 1 that is to receive the metallic pattern. In the case of the digitizer platen of FIG. 2 the layer 2 of the photopolymerizable adhesive is a dry film photoresist available from E. I. du Pont de Nemours and Company under the registered trademark "Riston". It has been found that "type 6" Riston ® is well suited to practicing the invention in connection with the digitizer platen of FIG. 2. Another dry-film photoresist that is usable is type GTC photoresist available from the Dynachem Corporation of Tustin, Calif.

Riston ® has three layers: a carrier sheet of polyester film; a center layer of photopolymerizable resist; and a cover-separator sheet of polyolefin. The nature of the photopolymerizable resist in Riston ® that is here used as a photopolymerizable adhesive may be understood with reference to U.S. Pat. No. 3,469,982, issued Sept. 30, 1969 to J. R. Celeste. That patent mentions four other U.S. Patents that are of interest. These are U.S. Pat. Nos.: Palmbeck, 2,760,863; Schoenthaler, 3,418,295; Celeste, 3,261,686; and, Cohen and Schoenthaler, 3,380,831. Each of these five aforementioned patents is hereby incorporated by reference.

Riston ® is available in rolls and can be applied with heat and pressure by a laminating machine. A Du Pont Riston ® Laminator, model no. HRL was found effective. The cover-separator sheet is removed and the soft and slightly tack layer of photopolymerizable resist is brought into intimate contact with the substrate 1 by a heated pinch roller. The lamination is done with a temperature setting of 250 degrees Fahrenheit and a speed of three feet per minute. Just prior to step three the carrier sheet is removed, leaving the layer 2 shown in step two of FIG. 1.

Step three in FIG. 1 is the application of the metal foil 3 to the layer 2 of photopolymerizable adhesive. In the case of the digitizer platen of FIG. 2 this is accomplished by running the substrate 1 through the laminating machine again with a roll of copper foil passing under the pinch roller. This lamination is performed in two passes with a temperature setting between 235 and 250 degrees Fahrenheit and a speed of three feet per minute. During the first pass the copper foil is applied. Following the first pass the piece is turned ninety degrees and put through the laminator again, but without the application of additional copper. The foil 3 adheres to the soft tacky layer 2, to produce the cross section shown in step three of FIG. 1.

The copper foil has been previously treated with one of the commerically available adhesion enhancing processes that increases that surface area on the side of the foil to be laminated. Examples of this are copper foils having the "TC treatment", available from Gould, Inc., McConnelsville, Ohio, and copper foils having the "TW treatment", available from Yates Industries, of Bordentown, N.J. The treated side is the side laminated to the layer 2 of photopolymerizable adhesive.

It will be understood by those skilled in the art that the use of different materials for the substrate or foil may require the use of different temperatures and speeds to obtain optimum results.

Step four of FIG. 1 is the application of a layer 4 of photosensitive resist to the exposed surface of the metal foil 3. Any conventional technique for the application of any of the various types of photosensitive resists can be employed. In the case of the digitizer platen of FIG. 2 the layer 4 of photosensitive resist is another layer of Riston ®, applied with a temperature setting of 230 degrees Fahrenheit and a speed of six feet per minute.

Step five of FIG. 1 is the exposure of the layer 4 of photosensitive resist to actinic radiation whose image is the actual desired metallic pattern (for "negative" photoresists), or whose image is the "shadow" of the desired metallic pattern (for "positive" photoresists). In the case that the layer 4 of photosensitive resist is Riston ®, the image is the actual image, since Riston ® is a "negative" photoresist that polymerizes whenever the actinic radiation (ultraviolet light) strikes its surface.

Step six of FIG. 1 is the development of the pattern 5 in the layer 4 of the photosensitive resist. In the case that the layer 4 of photosensitive resist is Riston ® this is accomplished by washing away the unexposed regions of the layer 4 with a rinse of a chlorinated solvent, such as 1, 1, 1-trichloroethane.

Step seven of FIG. 1 is the etching of the metallic foil 3 to produce in it the desired pattern 6. The step of etching the metal foil is conventional and its details are well known. Etching the metal foil 3 produces the cross section shown in step seven of FIG. 1. The layer 2 of photopolymerizable adhesive has at this point been uncovered in those places where the metal foil 3 has been etched away. The uncovered portions of the layer 2 may interfere with transparency of the substrate 1 or be otherwise undesirable, but are easily removable as described in connection with step eight below, provided that the layer 2 has not been exposed to actinic radiation. Accordingly, step eight requires that steps two through seven be performed without exposing any unwanted part of the layer 2 of photopolymerizable adhesive to actinic radiation which would initiate polymerization.

Step eight is the removal of the uncovered portions of the layer 2 of photopolymerizable adhesive. If the layer 2 is Riston ® then the unwanted portions may be removed by rinsing with a chlorinated solvent, such as 1, 1, 1-trichloroethane. The pattern 6 in the metal foil and the remaining portions of the layer 4 of photosensitive resist themselves act as a resist for the removal of the unwanted portions of the layer 2 of photopolymerizable adhesive. This produces the cross section shown in step eight of FIG. 1.

After step eight, the adhesive is still soft and pliable. The remaining adhesive 8 can be hardened by polymerizing it with exposure to actinic radiation, as described below in connection with step nine.

Step nine is the optional polymerization of the remaining portions 8 of the layer of polymerizable adhesive. In the case where the substrate 1 is transparent, such as for the digitizer platen of FIG. 2, this polymerization is easily accomplished by exposing the adhesive to actinic radiation from the side of the substrate opposite that to which the metallic pattern is attached. If the polymerizable adhesive is Riston ® the actinic radiation is ultraviolet light.

Figure 2:
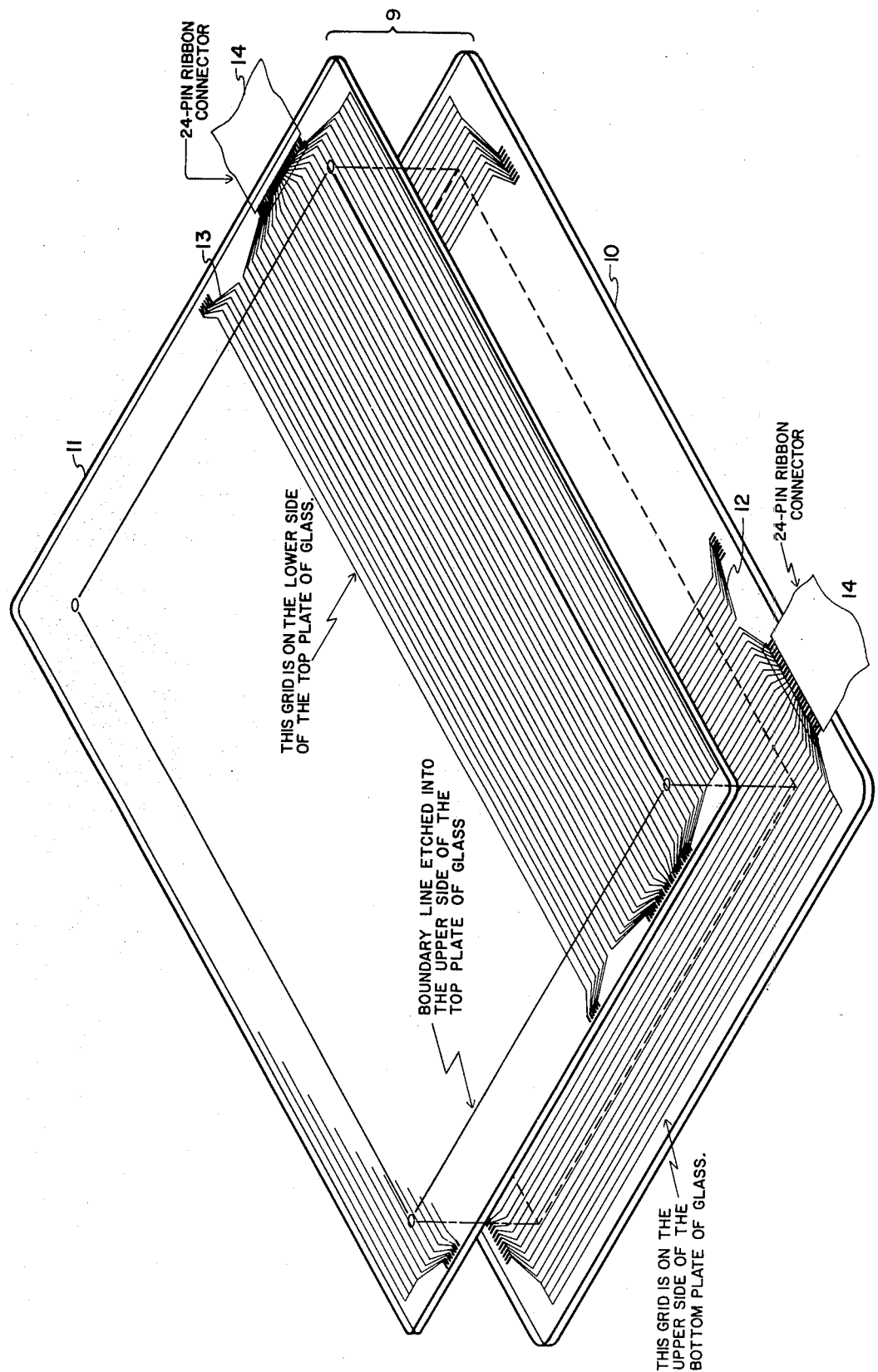
FIG. 2 illustrates a digitizer platen produced in accordance with the sequence of steps of FIG. 1.

Shown in FIG. 2 is partically exploded transparent digitizer platen 9 constructed in accordance with the method of FIG. 1. The upper piece of glass 11 and lower piece of glass 10 are each pieces of 3/16 inch thick float glass. The top surface of the upper piece is previously frosted by lapping with aluminum oxide to act as a screen for receiving a projected image. The orthogonal metallic grids 13 and 12 are etched from 0.007 inch thick copper foil (having the "TC" or "TW" treatment) laminated to glass pieces 11 and 10 with layers of 0.00075 inch thick "type six" Riston ®. The grids 13 and 12 are etched using additional layers of Riston ® as a photoresist.

The etched grids include soldering pads to which are soldered ribbon connectors 14. Prior to soldering the ribbon connectors the outer layer of Riston ® that served as a resist for etching the grids must be removed from the area to be soldered. This is performed by wiping the pads with a cloth soaked in a solvent such as methylene chloride.

Following this the two pieces of glass 11 and 10 are registered and laminated together with a 0.040 inch thick layer of polyvinyl butyral resin 15 to produce the cross section shown in FIG. 3. The lamination proceeds in three stages. During an initial stage lasting approximately ten minutes the platen is gradually compressed to 750 psi at 280° F. During a high pressure stage the pressure is gradually raised to 40,000 psi while the temperature is maintained at 280° F. During this stage the polyvinyl butyral resin 15 flows outward from between the two pieces of glass 11 and 10, by perhaps as much as ¼ inch at the edges for a sixteen inch by twenty-one inch platen. The adhesion of the polymerized Riston ® is sufficient to allow the grids 13 and 12 to resist the hydraulic shear forces and remain in place. A cooling stage of approximately fifteen minutes follows the high pressure stage, during which the temperature is gradually lowered to an ambient level while the high pressure of 40,000 psi is maintained. Following this, the pressure is removed and any polyvinyl butyral resin extruded from between the pieces of glass is trimmed away. The result is a transparent digitizer platen 9 that is virtually a piece of safety plate glass having imbedded within it a pair of highly accurate orthogonal grids with internally attached ribbon conductors extending for external connection.

We claim:

1. A process for producing upon a transparent substrate a pattern in a metallic foil, comprising the steps of:
    applying a layer of photopolymerizable adhesive to a first surface of the transparent substrate;
    applying an etchable metallic foil to the layer of photopolymerizable adhesive;
    applying a layer of photoresist to the etchable metallic foil;
    exposing the photoresist to a desired pattern of actinic radiation;
    removing the exposed photoresist to uncover the underlying etchable metallic foil;
    etching away the uncovered portion of the etchable metallic foil;
    etching away the portions of the layer of photopolymerizable adhesive uncovered by the step of etching the etchable metallic foil; and
    polymerizing the remaining photopolymerizable adhesive by exposing it to actinic radiation passing through the transparent substrate from a second surface opposite the first surface.

2. A digitizer platen comprising at least one transparent substrate upon which a metallic grid has been produced in accordance with the process of claim 1.

* * * * *

UNITED STATES PATENT AND TRADEMARK OFFICE
CERTIFICATE OF CORRECTION

PATENT NO. : 4,288,282
DATED : September 8, 1981
INVENTOR(S) : Lawrence E. Brown et al It is certified that error appears in the above—identified patent and that said Letters Patent is hereby corrected as shown below:

Column 4, line 8, "that" (second occurrence) should be --the--;

Signed and Sealed this

Twenty-ninth Day of December 1981

[SEAL]

Attest:

GERALD J. MOSSINGHOFF

Attesting Officer

Commissioner of Patents and Trademarks